United States Patent
Lai

(10) Patent No.: US 6,177,341 B1
(45) Date of Patent: Jan. 23, 2001

(54) METHOD FOR FORMING INTERCONNECTIONS IN SEMICONDUCTOR DEVICES

(75) Inventor: Guan-Ren Lai, Hsinchu (TW)

(73) Assignee: Vanguard International Semiconductor Corporation, Hsinchu (TW)

( * ) Notice: Under 35 U.S.C. 154(b), the term of this patent shall be extended for 0 days.

(21) Appl. No.: 09/594,959

(22) Filed: Jun. 15, 2000

(51) Int. Cl.[7] .............................................. H01L 21/4763
(52) U.S. Cl. .................... 438/637; 438/643; 438/648; 438/663
(58) Field of Search ................................. 438/637, 643, 438/644, 648, 653, 654, 656, 663

(56) References Cited

U.S. PATENT DOCUMENTS

| | | | |
|---|---|---|---|
| 5,416,045 | * 5/1995 | Kauffman et al. | 438/660 |
| 5,591,671 | 1/1997 | Kim et al. | 438/630 |
| 5,591,672 | 1/1997 | Lee et al. | 438/533 |
| 5,705,442 | * 1/1998 | Yen et al. | 438/653 |
| 5,712,193 | * 1/1998 | Hower et al. | 438/643 |
| 5,780,356 | * 7/1998 | Kim | 438/627 |
| 5,874,355 | * 2/1999 | Huang et al. | 438/627 |
| 5,970,378 | * 10/1999 | Shue et al. | 438/656 |
| 6,048,788 | * 4/2000 | Huang et al. | 438/629 |

* cited by examiner

Primary Examiner—T. N. Quach
(74) Attorney, Agent, or Firm—Wood, Herron & Evans, L.L.P.

(57) ABSTRACT

The present invention provides an effective rapid thermal annealing process to fill a narrow contact window and to interconnect two conductive layers in semiconductor devices. The present invention rapidly raises an annealing temperature by a simple step of temperature raising under pure nitrogen after a step of depositing a contact layer and a barrier layer and before a step of filling a conductive layer in the contact window. Therefore, ammonia, which requires disposal treatment, is avoided and a good interconnection can be accomplished at a relative low temperature without damaging the conductive layers.

12 Claims, 3 Drawing Sheets

METHOD FOR FORMING INTERCONNECTIONS IN SEMICONDUCTOR DEVICES

BACKGROUND OF THE INVENTION

1. Field of the Invention

The present invention relates to a method for forming interconnections in semiconductor devices and, more specifically, relates to a method for forming a plug in a contact window or a via hole to connect two conductive layers respectively disposed above and below the hole in semiconductor devices.

2. Description of the Prior Art

As integrated circuit technology develops, methods of fabrication for most devices in a limited space is a task that needs to be overcome. A contact window or a via hole has been widely applied to form an interconnection of two conductive layers in semiconductor devices. Since the sizes of the contact window and via hole are shrinking due to process requirements, one of the most important tasks is how to form a good conductive plug to connect two conductive layers without obstructing conductivity, as the sizes of the contact window and via hole become smaller.

One of conventional methods for forming interconnections in semiconductor devices is first forming a hole in a dielectric layer on a semiconductor substrate. A first conductive layer, which can be a potion of the semiconductor substrate being implanted with an impurity or can be any conductive layer, is disposed under the dielectric layer. A contact layer, which is usually made of titanium, is deposited on inner surface of the hole and a barrier layer, which is usually made of titanium nitride, is deposited on the contact layer. Then, a second conductive layer fills the hole to form a conductive plug. Finally, a third conductive layer is formed on the second conductive layer, thereby, the third conductive layer connects the first conductive layer by the second conductive layer to form the interconnections in semiconductor devices.

In the above conventional method, the contact layer is used to effectively connect the second conductive layer and dielectric layer, which would otherwise have poor contacts, and to allow the second conductive layer to have good ohmic contact with the underneath first conductive layer. For example, when the first conductive layer contains silicon, the titanium of the contact layer will react with the silicon to produce a titanium silicon compound, which forms an effective ohmic contact. The barrier layer is used to protect the contact layer from being damaged by reactive gas, which is applied in a consequent depositing step of the second conductive layer. For example, the second conductive layer is usually made of a tungsten compound, and tungsten hexafluoride, which is applied in forming a tungsten plug, will produce reactive fluoride ions to attack the contact layer.

Since the conventional method cannot prevent the contact layer from fluoride ion attacks due to poor deposition of the barrier layer, and cannot avoid problems which result from the loss of the contact layer, such as peeling of the contact layer and barrier layer, and volcano effects which occur due to a rise in deposition, a rapid thermal annealing process is introduced to the method. U.S. Pat. No. 5,591,672 discloses an annealing process which introduces ammonia and raises the annealing temperature to above 700° C., after depositing a titanium contact layer and titanium nitride barrier layer in the contact window. This allows ammonia to react with an exposed portion of the titanium contact layer and to form titanium nitride which repels fluoride ion attacks. The contact window is then filled with a metal layer.

The annealing process introduces nitrogen gas at a flow rate of 20 liters per minute at standard state into a thermal annealing chamber and loads therein a wafer, when the chamber temperature reaches 350° C. to 450° C. A first temperature raising step commences: the annealing chamber temperature is rapidly raised to between 575° C. and 625° C. and lasts for 60 seconds. Next, a second temperature raising step commences: the temperature is rapidly raised to between 700° C. and 745° C. The gas introduced into the chamber for both steps is ammonia, at a flow rate between 2 and 5 liters per minute. Lastly, nitrogen, at a flow rate of 20 liters per minute at standard state, is introduced into the chamber to rapidly lower the chamber temperature to below 350° C. and the wafer is removed from the chamber.

Although the method may ease volcano effects, some problems remain unsolved. The annealing process of wafers in the rapid thermal annealing chamber is characterized by the introduction of ammonia, two temperature raising steps, and an annealing temperature higher than 700° C. The introduction of ammonia results in the disadvantage of requiring ammonia waste gas disposal treatment, since the ammonia is an air pollutant and is not allowed to be directly expelled into the environment without treatment. Furthermore, the high temperature may damage the conductive layer under the contact hole, for example impurities of a source and/or a drain of a field effect transistor, may cause device failures and can cause a reduction in production yields.

U.S. Pat. No. 5,591,671 discloses a method for forming interconnections. Although the method uses a high temperature process, the high temperature process is carried out after the deposition of the titanium contact layer and titanium nitride barrier layer, and the filling of a metal layer in the contact window. The reason why the high temperature process is carried out after the filling of metal layer in the contact window is to prevent the contact layer and barrier layer from thermal oxidation. The method can not avoid conventional problems such as volcano effects. Moreover, the high temperature process is carried out in a conventional furnace, which raises and lowers the temperature slowly to prevent a quartz tube in the furnace from being broken. The temperature raising and lowering rates are about 4 to 5° C. per minute, which is a slower rate than that of a rapid thermal process. A preferred embodiment of the method is by raising the temperature of the furnace, which is full of nitrogen, from 450° C. to between 500° C. and 550° C. The step of raising the temperature requires ten to sixty minutes to complete.

SUMMARY OF THE INVENTION

An object of the present invention is to provide a method for forming interconnections in semiconductor devices. The method is to fill a small contact window or via hole to interconnect two conductive layers in semiconductor devices. In order to achieve high quality interconnections at a relatively low temperature, for avoiding thermal damage of the conductive layers, the present invention discloses an effective rapid thermal annealing process which raises temperature rapidly. The temperature is raised by a simple step of using pure nitrogen after a step of depositing a contact layer and a barrier layer and before a step of filling a conductive layer in the contact window. Consequently, the use of ammonia which requires disposal treatment is avoided, production efficiency is increased, and the cast of waste gas treatment is greatly reduced.

In order to achieve the above object and to avoid the disadvantages of the conventional methods, the present invention discloses a method for forming interconnections in semiconductor devices. The method comprises the following steps, Providing a semiconductor substrate and forming a first conductive layer on the semiconductor substrate; forming a dielectric layer on the first conductive layer; forming a first hole through the dielectric layer, wherein the bottom of the first hole contacts the first conductive layer; forming a contact layer on the dielectric layer, and on the contact surface of the first hole and the first conductive layer, wherein the first hole is reduced to a second hole; forming a barrier layer on the contact layer, wherein the second hole is reduced to a third hole;

Carrying out a rapid thermal annealing process, which comprises the following steps: placing the semiconductor substrate, which is at an ambient temperature, into a quartz heating chamber, wherein the chamber is filled with nitrogen gas at a first flow rate; reducing the first flow rate to a second flow rate, rapidly heating the semiconductor substrate to a high temperature, which lasts for a period of time; and increasing the second flow rate to a third flow rate, rapidly reducing the semiconductor substrate temperature, and taking the semiconductor substrate out of the quartz heating chamber;

Then, filling the third hole with a second conductive layer; and forming a third conductive layer on the second conductive layer, wherein the third conductive layer connects the first conductive layer with the second conductive layer to form the interconnections in the semiconductor devices.

In the rapid thermal annealing process of the disclosed method, the high temperature is between 500 and 600° C., and preferably between 530 and 580° C. The period of time that the high temperature lasts for is preferably between 15 and 120 seconds. The first and the third flow rates of the nitrogen gas are preferably between 15 and 40 liters per minute, at standard state, and the second flow rate is preferably between 2 and 7 liters per minute, at standard state.

Preferably, the first conductive layer is a portion of the semiconductor substrate being implanted with an impurity, a polysilicon layer or a metal line. Furthermore, the contact layer is made of titaniumand the barrier layer is made of titanium nitride.

By the disclosed method of the present invention, not only can volcano effects be avoided, but production yields can also be increased. Furthermore, by introducing pure nitrogen and by lowering the rapid thermal annealing temperature, ammonia, which requires disposal treatment, is avoided and thermal damage to devices can be avoided. One step of rapid temperature raising also simplifies the thermal annealing process.

The foregoing and other objects and advantages of the invention and the manner in which they are accomplished will become clearer based on the following detailed description taken in conjunction with the accompanying drawings.

BRIEF DESCRIPTION OF THE DRAWING

FIGS. 1 to 7 depict a cross-sectional view of a method for forming interconnections according to an embodiment of the present invention, wherein:

FIG. 1 depicts providing a semiconductor substrate and forming a first conductive layer on the same;

FIG. 2 depicts forming a dielectric layer on the first conductive layer;

FIG. 3 depicts forming a first hole through the dielectric layer;

FIG. 4 depicts forming a contact layer and a second hole;

FIG. 5 depicts forming a barrier layer and a third hole, and carrying out a rapid thermal annealing process;

FIG. 6 depicts filling the third hole with a second conductive layer;

FIG. 7 depicts forming a third conductive layer to complete the interconnections.

DETAILED DESCRIPTION OF THE INVENTION

Hereinafter, please refer to the drawings for the description of an embodiment of the present invention.

Figure 1:
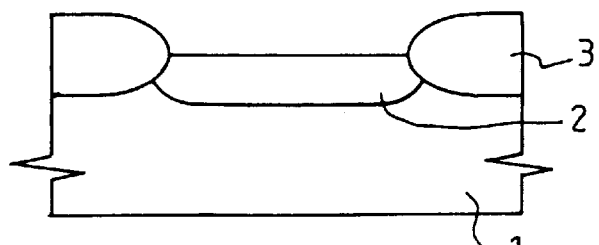

First, please refer to FIG. 1. A semiconductor substrate 1 is provided, on which a first conductive layer 2 is formed. The semiconductor substrate 1 is a silicon wafer, and the first conductive layer 2 is an N-type or P-type conductive area which is formed by being implanted with an impurity after a field oxide layer 3, which is for isolating the conductive area, is produced by the oxidation of a portion of the semiconductor substrate 1.

On the other hand, the first conductive layer 2 may be a polysilicon conductive layer or a metal conductive layer. Under such a circumstance, a hole formed by subsequent steps is called a via hole.

Figure 2:
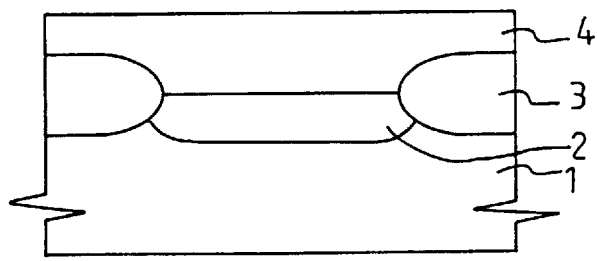

FIG. 2 depicts forming a dielectric layer 4 on the first conductive layer 2. The dielectric layer 4 can be made of silicon dioxide, boronphosphosilicate glass or other dielectric materials, known by persons in the art, and can be formed by chemical vapor deposition.

Figure 3:
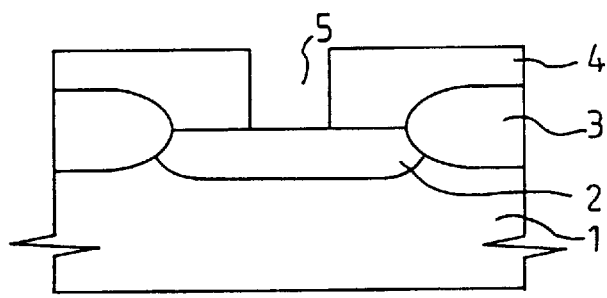

Next, FIG. 3 depicts forming, a first hole 5 through the dielectric layer 4. In the embodiment, the first hole 5 is well known as a contact window, whose size depends on process requirements and can be 0.3 micrometers or even smaller. The first hole 5 is formed by etching through the dielectric layer 4 and the etching stops underneath the first conductive layer 2.

Figure 4:
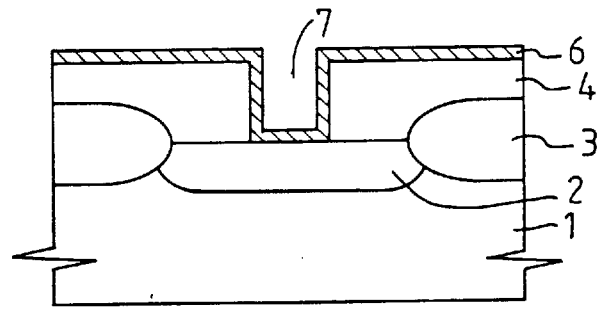

Please refer to FIG. 4. A contact layer 6 is formed on the inner surface of the dielectric layer 7 around the first hole 5 shown in FIG. 3 and on the first conductive layer 2. The contact layer 6 is formed by depositing titanium metal in the first hole 5 and on the surface of the dielectric layer 4 by chemical vapor deposition. The thickness of the contact layer 6 is between 300 Å and 1200 Å. The first hole 5, after being deposited with the contact layer 6, is reduced to a second hole 7.

Figure 5:
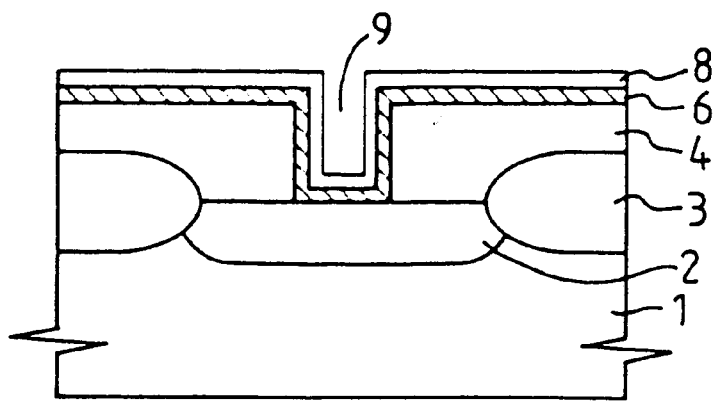

Please refer to FIG. 5. A barrier layer 8 is formed on the contact layer 6. The barrier layer 8 can be made by depositing titanium nitride on the contact layer 6 by either chemical vapor deposition or sputtering. The thickness of the barrier layer 8 is normally between 400 Å and 1200 Å. The second hole 7, after being deposited with the barrier layer 8, is reduced to a third hole 9. And then, a rapid thermal annealing process, which will be described in greater detail later, is carried out.

Figure 6:
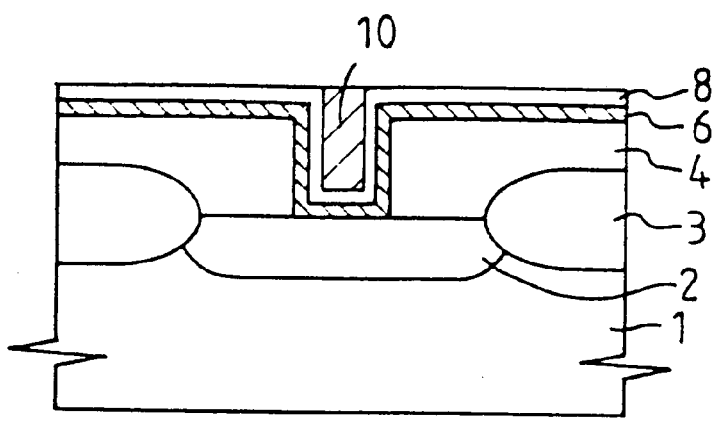

Please refer to FIG. 6. The third hole 9, shown in FIG. 5, is filled with a second conductive layer 10 to form a plug. The most common plug material is tungsten, which is made by low-pressure chemical vapor deposition in using tungsten hexafluoride with hydrogen, or tungsten hexafluoride with silane and hydrogen as reaction gas. Usually, an etching-back step is required to finish the plug, which is formed by the second conductive layer 10.

Figure 7:
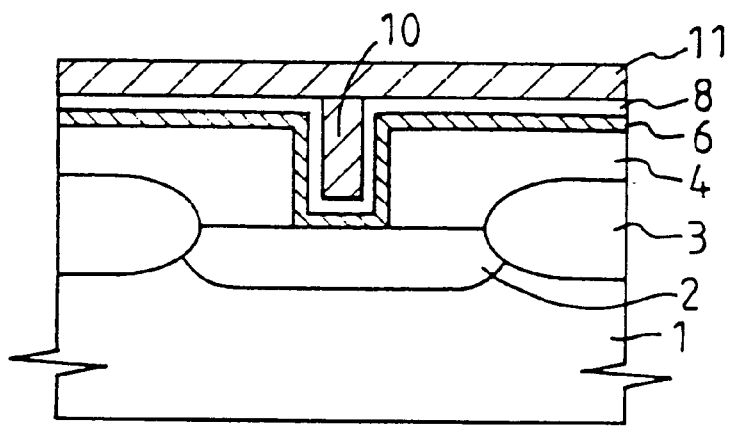

Lastly, please refer to FIG. 7. A third conductive layer 11 is formed on the second conductive layer 10. Normally the third conductive layer 11 is made of conductive materials such as polysilicon or metal. After conductive material deposition, the third conductive layer 11 is formed by photolithographic patterning and etching. Thereby, the first conductive layer 2 can connect the third conductive layer 11 via the second conductive layer 10 to form the interconnections.

Rapid Thermal Annealing Process

Figure 8:
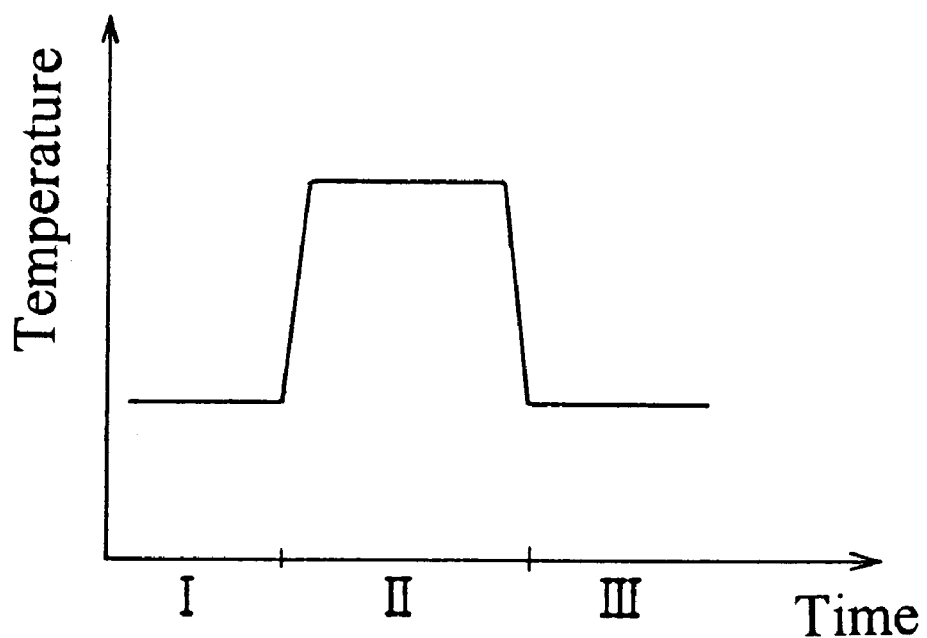
FIG. 8 depicts a relation between temperature and time in the rapid thermal annealing process.

FIG. 8 depicts a relation between temperature and time in the rapid thermal annealing process, according to the embodiment of the present invention. The semiconductor substrate 1 then subjected to the rapid thermal annealing process after depositions of the contact layer 6 and barrier layer 8. The semiconductor substrate 1, being at ambient temperature, is loaded into a quartz heating chamber, which is filled with exclusive nitrogen gas at a first flow rate. The first flow rate of the nitrogen gas is between 15 and 40 liters per minute, at standard state.

Next, the first flow rate is reduced to a second flow rate, and a step of rapid temperature raising is implemented to heat the semiconductor substrate 1 to a high temperature. The high temperature lasts for a period of time, which is preferably from 15 to 120 seconds. The high temperature is between 500 and 600° C., and preferably between 530 and 580° C. The second flow rate of the nitrogen gas is between 2 and 7 liters per minute at standard state. The rapid temperature raising step of the semiconductor substrate 1 from the ambient temperature to the high temperature is completed in less then ten seconds.

For a traditional furnace, temperature raising and lowering rates are low and the furnace temperature is about the same as the semiconductor substrate. The temperature raising rate is normally between 4 and 5° C. per minute, at a maximum of 25° C. per minute, and the temperature lowering rate is less than 5° C. per minute, in order to prevent the quartz tube in the furnace from being broken. In contrast, the temperature raising rate of the present invention is between 5 and 200° C. per second, normally 80° C. per second, and the temperature lowering rate can reach 16° C. per second. This is because although the rapid annealing quartz heating chamber of the present invention is also made of quartz, the heating source is an IR light which emits light piercing through the quartz but being absorbed by the semiconductor substrate and therefore the semiconductor substrate is heated to a temperature far higher than the quartz chamber.

At the high temperature stage, the rapid thermal annealing process allows the titanium contact layer 6 and titanium nitride barrier layer 8 to have their atomic structures be rearranged, to release accumulated stress during deposition and to form densely deposited films. The high temperature stage of the rapid thermal annealing process also allows partially reacted titanium nitride during deposition to form a stable film, and allows exposed titanium, resulted from poor deposition, to form titanium nitride on surface thereof and to avoid fluoride ion attacks in subsequent processes and to avoid occurrence of gaseous titanium fluoride compounds and resulted volcano effects. Furthermore, an ohmic contact is formed having a lower resistance from titanium silicon compounds which are produced by reactions of the titanium contact layer 6 and the semiconductor substrate 1 at the high temperature stage. Since the high temperature is a relatively low temperature, comparing with 700° C. in the conventional annealing process, the first conductive layer 2 is prevented from being thermal damaged.

Next, the second nitrogen flow rate is increased to a third flow rate. The semiconductor substrate 1 temperature is rapidly lowered, and the semiconductor substrate 1 is removed from the quartz heating chamber. Wherein the third flow rate of the nitrogen gas is between 15 and 40 liters per minute, at standard state, and the temperature lowering time depends on the nitrogen gas flow rate and the unloaded temperature of the semiconductor substrate 1. Usually the temperature decreasing time lasts for 20 seconds or longer.

In summary, the rapid thermal annealing process is carried out exclusively under nitrogen, and a simple step of temperature raising is shown in FIG. 8. In step I, the semiconductor substrate 1 is loaded into the quartz heating chamber; in step II, the semiconductor substrate 1 is raised to a high temperature and lasts for a period of time; and in step III, the semiconductor substrate 1 temperature is rapidly lowered and is then removed from the quartz heating chamber.

Cp1 yield results according to embodiments of the present invention, with various titanium contact layer thickness and high temperatures in combination with an 800 Å thick titanium nitride barrier layer, are shown in the following table (the quartz heating chamber applied in the rapid thermal annealing process is Anelva D1060):

| Thickness of | High temperature | | |
|---|---|---|---|
| contact layer | 500° C. | 530° C. | 580° C. |
| 100 Å | 82.57% | 85.45% | 86.59% |
| 200 Å | 83.78% | 88.41% | 85.41% |
| 400 Å | 83.00% | 84.46% | 82.24% |
| 800 Å | 80.30% | 83.11% | 82.29% |

Wherein the first flow rate of the nitrogen gas is 4 liters per minute, at standard state, and the high temperature lasts for a period of 45 seconds.

By the disclosed method for forming interconnections in semiconductor devices of the present invention, a contact layer is thoroughly protected and volcano effects are prevented. Furthermore, ammonia gas waste treatment and thermal damage of devices can be avoided by introducing pure nitrogen and lowering the high temperature of the rapid thermal annealing process. The process is simplified and production yields can be enhanced as well.

The preferred embodiments of the invention have been exemplified. However, it can be understood that equivalent variations can be made without departing from the scopes and spirits of the present invention. Therefore, any apparent modifications and changes made by persons skilled in the art should be covered in the following claims.

What is claimed is:

1. A method for forming interconnections in semiconductor devices, comprising the following steps:
    (a) providing a semiconductor substrate;
    (b) forming a first conductive layer on the semiconductor substrate;
    (c) forming a dielectric layer on the first conductive layer;
    (d) forming a first hole through the dielectric layer, wherein the bottom of the first hole contacts the first conductive layer;
    (e) forming a contact layer on the dielectric layer and on the contact surface of the first hole and the first conductive layer, wherein the first hole is reduced to a second hole;
    (f) forming a barrier layer on the contact layer, wherein the second hole is reduced to a third hole;
    (g) carrying out a rapid thermal annealing process, comprising the following steps:

placing the semiconductor substrate, which is at ambient temperature, into a quartz heating chamber, wherein the chamber is filled with nitrogen gas at a first flow rate;

reducing the first flow rate to a second flow rate, rapidly heating the semiconductor substrate to a high temperature and lasting for a period of time; and increasing the second flow rate to a third flow rate, rapidly reducing the semiconductor substrate temperature, and taking the semiconductor substrate out of the quartz heating chamber;

(h) filling the third hole with a second conductive layer; and (i) forming a third conductive layer on the second conductive layer, wherein the third conductive layer connects the first conductive layer by the second conductive layer.

2. The method of claim 1, wherein the high temperature in the rapid thermal annealing process is between 500 and 600° C.

3. The method of claim 1, wherein high temperature in the rapid thermal annealing process is between 530 and 580° C.

4. The method of claim 1, wherein the period of time in the rapid thermal annealing process is between 15 and 120 seconds.

5. The method of claim 1, wherein the first flow rate of the nitrogen gas in the rapid thermal annealing process is between 15 and 40 liters per minute, at standard state.

6. The method of claim 1, wherein the second flow rate of the nitrogen gas in the rapid thermal annealing process is between 2 and 7 liters per minute, at standard state.

7. The method of claim 1, wherein the third flow rate of the nitrogen gas in the rapid thermal annealing process is between 15 and 40 liters per minute, at standard state.

8. The method of claim 1, wherein the first conductive layer is a portion of the semiconductor substrate being implanted with impurity.

9. The method of claim 1, wherein the first conductive layer is a polysilicon layer.

10. The method of claim 1, wherein the first conductive layer is a metal line.

11. The method of claim 1, wherein the contact layer is made of titanium.

12. The method of claim 1, wherein the barrier layer is made of titanium nitride.

* * * * *